US006639818B1

(12) United States Patent
Nojima

(10) Patent No.: US 6,639,818 B1
(45) Date of Patent: Oct. 28, 2003

(54) DIFFERENTIAL NON-VOLATILE CONTENT ADDRESSABLE MEMORY CELL AND ARRAY

(75) Inventor: Isao Nojima, Los Altos, CA (US)

(73) Assignee: Silicon Storage Technology, Inc., Los Altos, CA (US)

( * ) Notice: Subject to any disclaimer, the term of this patent is extended or adjusted under 35 U.S.C. 154(b) by 0 days.

(21) Appl. No.: 09/527,373

(22) Filed: Mar. 16, 2000

(51) Int. Cl.$^7$ .............................................. G11C 15/00

(52) U.S. Cl. ....................................................... 365/49

(58) Field of Search ............................ 365/49, 185.01, 365/185.14, 185.28, 185.29

(56) References Cited

U.S. PATENT DOCUMENTS

| | | | | |
|---|---|---|---|---|
| 5,029,130 A | | 7/1991 | Yeh ............................. | 365/185 |
| 5,051,948 A | * | 9/1991 | Watabe et al. ................ | 365/49 |
| 5,930,161 A | | 7/1999 | Sheikholeslami et al. ..... | 365/49 |
| 5,949,696 A | | 9/1999 | Threewitt ................... | 365/185 |
| 6,005,790 A | * | 12/1999 | Chan et al. .................... | 365/49 |
| 6,078,513 A | * | 6/2000 | Ong et al. ..................... | 365/49 |
| 6,078,987 A | * | 6/2000 | Kongetira ................... | 711/108 |
| 6,094,368 A | * | 7/2000 | Ching ......................... | 365/49 |

OTHER PUBLICATIONS

Integratioin, the VLSI Journal 18 (1995) pp. 151–171, entitled Architectures for large–capatity CAM's, by K. Schultz, P.Glenn Gulak. Jun. 1995.

* cited by examiner

Primary Examiner—Richard Elms
Assistant Examiner—Anh Phung
(74) Attorney, Agent, or Firm—Gray Cary Ware & Freidenrich LLP

(57) ABSTRACT

A differential non-volatile content addressable memory array has a differential non-volatile content addressable memory cell which uses a pair of non-volatile storage elements. Each of the non-volatile storage elements can be a split-gate floating gate transistor or a stack gate floating gate transistor having a first terminal, a second terminal, a channel therebetween and a floating gate over at least a portion of the channel to control the conduction of electrons in the channel, and a control gate. The floating gate storage transistor can be in one of two states: erased in which current can flow between the first terminal and the second terminal, and programmed in which substantially no current flows between the first terminal and the second terminal. A word line connects to the control terminal of the pair of non-volatile floating gate transistors. A pair of differential data lines connects to the first terminals of each of the pair of non-volatile floating gate transistors. Finally, a match line connects to the second terminal of each of the pair of non-volatile floating gate transistors.

10 Claims, 2 Drawing Sheets

DIFFERENTIAL NON-VOLATILE CONTENT ADDRESSABLE MEMORY CELL AND ARRAY

TECHNICAL FIELD

The present invention relates to a content addressable memory cell and an array which is composed of non-volatile storage elements and in which data is queried by a pair of differential data lines.

BACKGROUND OF THE INVENTION

Content addressable memory cells and arrays are well known in the art. U.S. Pat. No. 5,949,696 discloses a differential volatile content addressable memory cell and an array made thereby.

Non-volatile content addressable memory cells and arrays are also well known in the art. U.S. Pat. No. 5,930,161 discloses a differential non-volatile content addressable memory cell and array using ferroelectric capacitors as storage elements. Referring to FIG. 1, there is shown a schematic block level diagram of a differential non-volatile content addressable memory array 8 as disclosed in FIG. 1 of U.S. Pat. No. 5,930,161. The array comprises a plurality of non-volatile content addressable memory cells 10 arranged in a plurality of rows and columns. In FIG. 1, the cells 10 are arranged in 4 rows by 4 columns. A word line (WL0 ... WL3) connects all the cells 10 in the same row. A match line ML (ML0 ... ML3) connects all the cells 10 in the same row and to an encoder 12. A pair of differential bit lines (BL0, BLN0 ... BL3, BLN3) connects all the cells 10 in the same column. The data to which a comparison to determine if a match exists is supplied to the reference word storage and bit line drivers 14. The data is then supplied to the particular column along a pair of particular bit lines. All the match lines (ML0 ... ML3) are connected to the encoder 12. When there is a match as determined by the particular match line going low (or high), the output of the encoder 12 indicates a hit as well as the address of the cell 10 where the match occurred.

Non-volatile floating gate storage elements are also well known in the art. These can be of the stacked gate type or the split gate type as exemplified by U.S. Pat. No. 5,029,130. In both the stack gate type or the floating gate type, charges on the floating gate affect the conduction of current in a channel in a semiconductor substrate. Typically, in one state, the floating gate is negatively charged such that no current flows in the channel. In a second state, when the floating gate is erased and there are no excess electrons, that state permits the conduction of current in the channel, when the floating gate is capacitively coupled to a positive voltage source.

SUMMARY OF THE INVENTION

A differential non-volatile content addressable memory cell comprises a pair of non-volatile storage elements in which each storage element has a first terminal, a second terminal, and a control terminal to control the flow of the current between the first terminal and the second terminal. Each of the storage elements has two non-volatile states. In a first state, a first current flows between the first terminal and the second terminal. In a second state, a second current less than the first current flows between the first terminal and the second terminal. A word line connects to the control terminals of the pair of non-volatile storage elements. A pair of differential data lines connects to the memory cell with one of the differential data lines connecting to the first terminal of one of the non-volatile storage elements and the other data line connecting to the first terminal of the other non-volatile storage element. A match line connects to the second terminal of each of the pair of non-volatile storage elements.

A differential non-volatile content addressable memory array using the foregoing described memory cell is also disclosed.

DETAILED DESCRIPTION OF THE DRAWINGS

Figure 1:
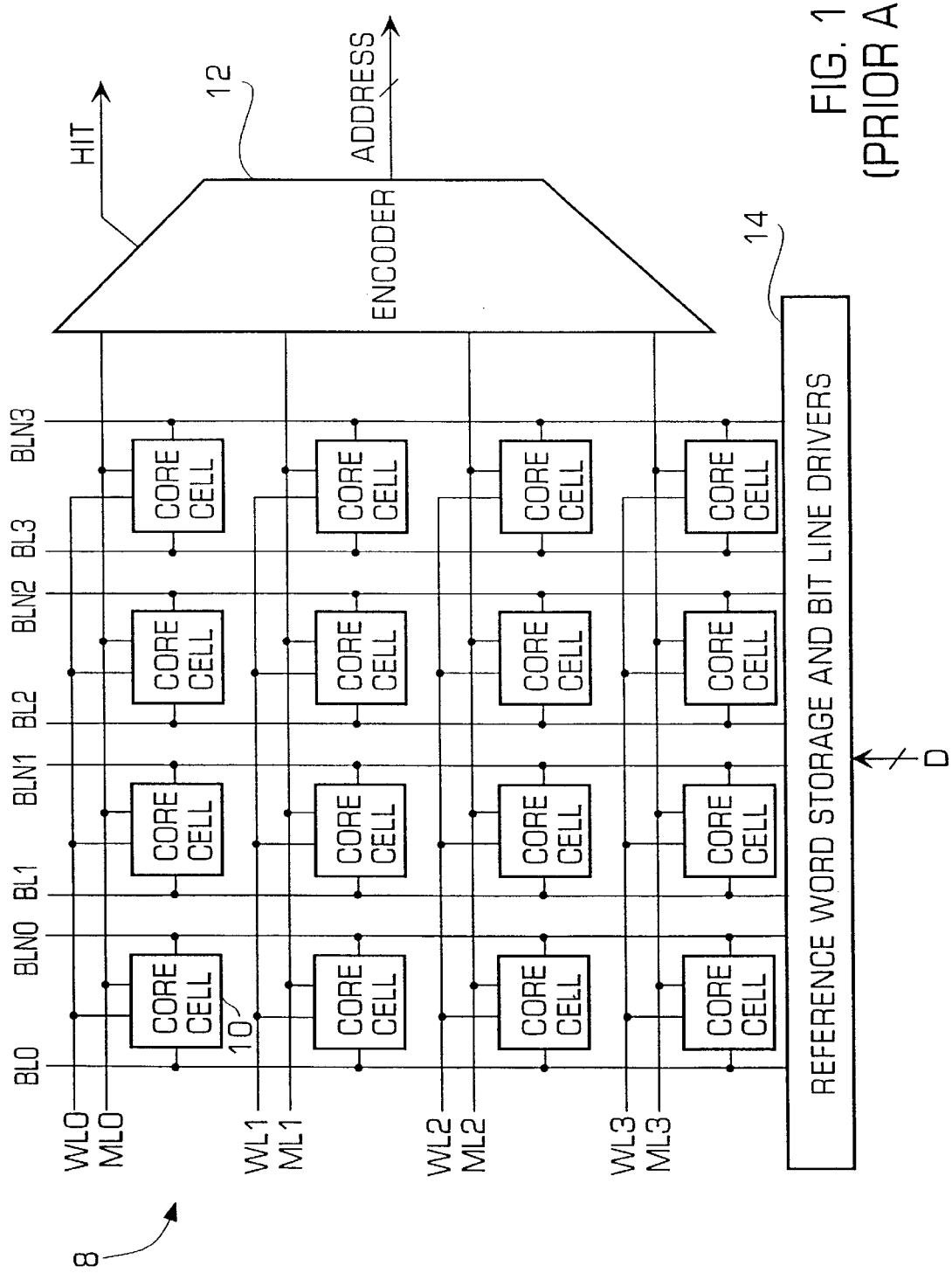
FIG. 1 is a schematic block level diagram of a differential non-volatile content addressable memory array of the prior art but to which the differential non-volatile content addressable memory cell of the present invention can be used.

Referring to FIG. 1, there is shown a schematic block level diagram of a differential non-volatile content addressable memory array 8 in which the differential non-volatile content addressable memory cell 20 of the present invention can be used to form a differential non-volatile content addressable memory array of the present invention.

Figure 2:
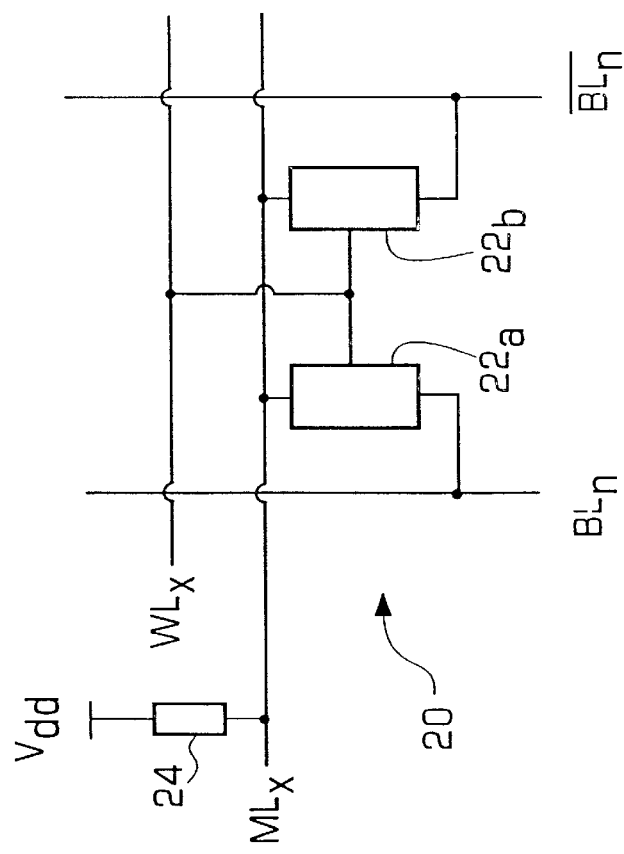
FIG. 2 is a circuit diagram of a differential non-volatile content addressable memory cell of the present invention using a pair of non-volatile storage elements.

The differential non-volatile content addressable memory cell 20 is shown in FIG. 2. The cell 20 comprises a pair of non-volatile storage elements 22a and 22b. Each of the non-volatile storage elements, 22a or 22b is a three-terminal device having a first terminal, a second terminal and a third terminal labeled the control terminal. A voltage on the control terminal controls the flow of the current between the first terminal and the second terminal. Further, each of the storage elements 22a and 22b is of a floating gate type, either a split-gate or a stacked-gate type, wherein the floating gate overlies a portion of the channel between the first terminal and the second terminal. The storage of electrons on the floating gate controls the current flow between the first terminal and the second terminal. In a first state, a first current flows between the first terminal and the second terminal. In a second state, a second current less than a first current flows between the first terminal and the second terminal. Typically, this second current is minuscule and is substantially zero.

The word line $WL_x$ connects to the control terminals of the pair of non-volatile storage elements 22a and 22b. A match line $ML_x$ connects to the second terminals of the non-volatile storage elements 22a and 22b. The match line $ML_x$ is connected through an impedance element 24 such as a resistor to a voltage source $V_{dd}$. A pair of differential data lines BL and $\overline{BL}$ connects to the cells 20. The data line BL connects to the first terminal of the storage element 22a. The data line $\overline{BL}$ connects to the first terminal of the storage element 22b.

Figure 3:
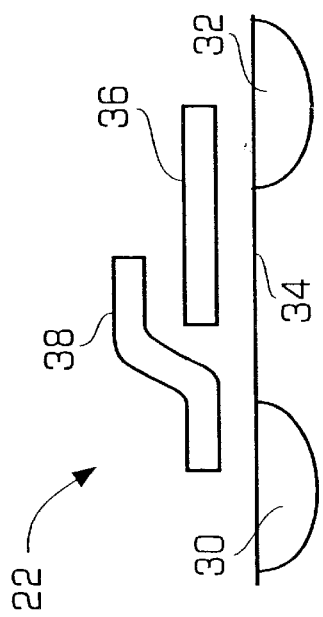
FIG. 3 is a cross-sectional view of a conventional split-gate floating gate non-volatile memory cell which can be used in the differential non-volatile content addressable memory cell of FIG. 2.

Referring to FIG. 3 there is shown a cross-sectional view of a first embodiment of a non-volatile storage element 22 that can be used in the memory cell 20. The non-volatile storage element 22 is fully disclosed in U.S. Pat. No. 5,029,130 whose disclosure is incorporated herein by reference. As disclosed in that patent, the storage element 22 has a first terminal 30 and a second terminal 32 in a semiconductor substrate with a channel 34 therebetween. A floating gate 36 is disposed over a first portion of the channel 34 and over the second terminal 32 and is insulated therefrom. A control gate 38 has a first section disposed over a second portion of the channel 34 and is insulated therefrom and has a second section over the floating gate 36 and is insulated therefrom. Further as disclosed in that patent, in operation, when the storage element 22 is in a first state, it is in an erase state. In that state, excess electrons are removed from the floating gate 36. A positive voltage applied to the control gate permits the flow of electrons between the first and second terminals 30 and 32 respectively through the channel 34. In the second state or the programmed state, electrons are injected onto the floating gate 36. In that event, even with a positive voltage applied to the control gate 38, current would not flow between the first terminal 30 and the second terminal 32 in the channel 34.

Figure 4:
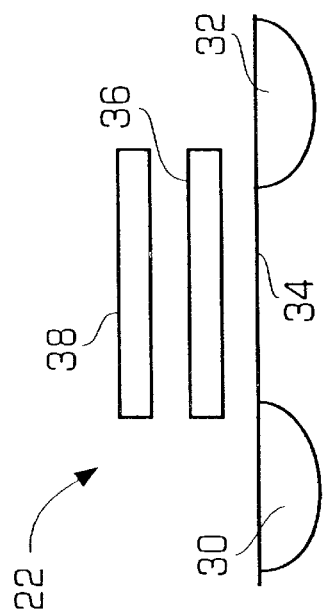
FIG. 4 is a is a cross-sectional view of a conventional stacked-gate floating gate non-volatile memory cell which can be used in the differential non-volatile content addressable memory cell of FIG. 2.

Referring to FIG. 4, there is shown a second embodiment of a storage element 22 which can be used in the memory cell 20 of the present invention. The second embodiment of the storage element 22 shown in FIG. 4 is a stacked gate type and is well known in the art. Similar to the embodiment shown in FIG. 3, the storage element 22 in FIG. 4 has a first terminal 30, a second terminal 32, with a channel 34 therebetween in a semiconductor substrate. A floating gate 36 is disposed over the channel 34 and is insulated therefrom. A control gate 38 is disposed over the floating gate 36 and is insulated therefrom. Similar to the first embodiment shown in FIG. 3, the storage element 22 has two states: a programmed state and an erased state. In the erased state, excess electrons are removed from the floating gate 36. A positive voltage applied to the control gate 38 is capacitively coupled to the floating gate 36 which then permits the flow of electrons in the channel 34 between the first and second terminals 30 and 32 respectively. In the programmed state, electrons are injected or placed on the floating gate 36. Even if a positive voltage were applied on the control gate 38, the excess electrons on the floating gate 36 inhibits the flow of electrons in the channel 34 between the first terminal 30 and the second terminal 32.

In the operation of the memory cell 20 of the present invention, we assume that the storage element 22a is in a programmed state and the storage element 22b is in the erased state. Thus, when a voltage is applied on the word line $WL_x$ which is supplied to the control terminal of the storage elements 22a and 22b, current would flow from the data line from $\overline{BL_n}$ to the match line $ML_x$.

If the data to be interrogated, supplied on the lines $BL_n$ and $\overline{BL_n}$ are 0 and 1 respectively, then the voltage on the match line $ML_x$ remains at high or near $V_{dd}$. This is because storage element 22b would conduct connecting $ML_x$ at high or near $V_{dd}$. If there is a match between other BL and $\overline{BL}$ lines in the same row with the match line ML, then the result of the interrogation of the differential non-volatile content addressable memory array would result in the ML line remaining high or near $V_{dd}$.

On the other hand, if however one of the interrogation lines $BL_n$ and $\overline{BL_n}$ is a mismatch, e.g. $BL_n$ is at 1 and $\overline{BL_n}$ is at 0, then $ML_x$ would go low. This is because with $\overline{BL_n}$ grounded, current would flow from $ML_x$ to $\overline{BL_n}$. This would lower the voltage on $ML_x$. Thus, a single mismatch in the entire row would cause the $ML_x$ line to go low.

Finally, if it is desired to skip the interrogation of a particular bit line with the particular cells 20, a condition known as masking, then $BL_n$ and $\overline{BL_n}$ are both held at high or at 1 and 1 respectively. In that condition, irrespective of the state of the non-storage elements 22a and 22b, $ML_x$ would remain at high and the interrogation of the possible matching of BL and $\overline{BL}$ to the cell would be skipped.

As can be seen from the foregoing, a simplified differential non-volatile content addressable memory cell and array is provided by the present invention.

What is claimed is:

1. A differential non-volatile content addressable memory cell comprising:

a pair of non-volatile storage elements, each having a first terminal, a second terminal, and a control terminal for controlling the flow of current between the first terminal and the second terminal; wherein each of said storage elements is characterized by capable of being in one of two non-volatile states: a first state in which a first current flows between said first terminal and said second terminal, and a second state in which a second current, less than said first current, flows between said first terminal and said second terminal;

a pair of differential data lines, each for connecting to the first terminal of one of said pair of non-volatile storage elements;

a match line connecting to the second terminals of each of said pair of non-volatile storage elements; and a word line connecting to the control terminals of each of said pair of non-volatile storage elements.

2. The memory cell of claim 1 further comprising:

a load connecting said match line to a voltage source.

3. The memory cell of claim 2 wherein said second current is substantially zero.

4. The memory cell of claim 1 wherein each of said storage elements comprises:

a first terminal in a semiconductor substrate;

a second terminal in said semiconductor substrate;

a channel between said second terminal and said first terminal;

a floating gate disposed over a first portion of said channel and said second terminal and is insulated therefrom; and a control gate having a first section disposed over a second portion of said channel and insulated therefrom, and having a second section over said floating gate and is insulated therefrom.

5. The memory cell of claim 1 wherein each of said storage elements comprises:

a first terminal in a semiconductor substrate;

a second terminal in said semiconductor substrate;

a channel between said first and second terminals;

a floating gate disposed over said channel and is insulated therefrom; and a control gate disposed over said floating gate and is insulated therefrom.

6. A differential non-volatile content addressable memory array comprising:

a plurality of non-volatile content addressable memory cells arranged in a plurality of rows and columns;

each non-volatile content addressable memory cell comprising a pair of non-volatile storage elements, each having a first terminal, a second terminal, and a control terminal for controlling the flow of current between the first terminal and the second terminal; wherein each of said storage elements is characterized by capable of being in one of two non-volatile states: a first state in which a first current flows between said first terminal and said second terminal, and a second state in which a second current, less than said first current, flows between said first terminal and said second terminal;

a word line in each row for connecting to the control terminals of the non-volatile content addressable memory cells in said row;

a pair of differential data lines in each column, each for connecting to the first terminal of one of said pair of non-volatile storage elements in each memory cell of said column; and a match line in each row for connecting to the second terminals of the non-volatile content addressable memory cells in said row.

7. The memory array of claim 6 further comprising:

a load connecting said match line to a voltage source.

8. The memory array of claim 7 wherein said second current is substantially zero.

9. The memory array of claim 6 wherein each of said storage elements comprises:

a first terminal in a semiconductor substrate;

a second terminal in said semiconductor substrate;

a channel between said first and second terminals;

a floating gate disposed over a first portion of said channel and said second terminal and is insulated therefrom; and a control gate having a first section disposed over a second portion of said channel and insulated therefrom, and having a second section over said floating gate and is insulated therefrom.

10. The memory array of claim 6 wherein each of said storage elements comprises:

a first terminal in a semiconductor substrate;

a second terminal in said semiconductor substrate;

a channel between said first and second terminals;

a floating gate disposed over said channel and is insulated therefrom; and a control gate disposed over said floating gate and is insulated therefrom.

\* \* \* \* \*